(12) United States Patent
Aboketaf et al.

(10) Patent No.: US 11,520,113 B1
(45) Date of Patent: Dec. 6, 2022

(54) PHOTODETECTORS AND TERMINATORS INCLUDING A TAPERED THICKNESS

(71) Applicant: GLOBALFOUNDRIES U.S. Inc., Malta, NY (US)

(72) Inventors: Abdelsalam Aboketaf, Essex Junction, VT (US); Yusheng Bian, Ballston Lake, NY (US); Edward Kiewra, South Burlington, VT (US); Brett Cucci, Colchester, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 7 days.

(21) Appl. No.: 17/356,898

(22) Filed: Jun. 24, 2021

(51) Int. Cl.
*G02B 6/42* (2006.01)
*H01L 31/0232* (2014.01)
*H01L 31/0203* (2014.01)
*G02B 6/136* (2006.01)

(52) U.S. Cl.
CPC ............ *G02B 6/4295* (2013.01); *G02B 6/136* (2013.01); *H01L 31/0203* (2013.01); *H01L 31/02327* (2013.01)

(58) Field of Classification Search
CPC ... G02B 6/4295; G02B 6/136; H01L 31/0203; H01L 31/02327
See application file for complete search history.

(56) References Cited

U.S. PATENT DOCUMENTS

| | | | | |
|---|---|---|---|---|
| 7,453,132 | B1* | 11/2008 | Gunn, III | H01L 31/0232 257/448 |
| 7,616,904 | B1* | 11/2009 | Gunn, III | H01L 31/0232 257/431 |
| 10,910,503 | B1* | 2/2021 | Bian | G02B 6/13 |
| 2021/0057592 | A1* | 2/2021 | Bian | G02B 6/12004 |
| 2022/0115546 | A1* | 4/2022 | Aboketaf | H01L 31/035281 |

OTHER PUBLICATIONS

Ter-Hoe (Isaac) Loh, "Lasers for Hybrid Silicon Photonic Integration" Photonics Spectra, Apr. 2021.
H. Chen et al., "-1 V bias 67 GHz bandwidth Si-contacted germanium waveguide p-i-n photodetector for optical links at 56 Gbps and beyond," Opt. Express 24, 4622-4631 (2016).
S. Assefa et al., "CMOS-Integrated 40GHz Germanium Waveguide Photodetector for On-chip Optical Interconnects," in Optical Fiber Communication Conference and National Fiber Optic Engineers Conference, OSA Technical Digest CD) (Optical Society of America, 2009), paper OMR4.

(Continued)

*Primary Examiner* — Andrew Jordan
(74) *Attorney, Agent, or Firm* — Thompson Hine LLP; Anthony Canale (57) ABSTRACT

Structures for a photodetector or terminator and methods of fabricating a structure for a photodetector or terminator. The structure includes a waveguide core, a light-absorbing layer having a sidewall, and a taper positioned adjacent to the sidewall of the light-absorbing layer. The taper extends laterally from the sidewall of the light-absorbing layer to overlap with the waveguide core, and the taper has a thickness that varies with position relative to the sidewall of the light-absorbing layer. For example, the thickness of the taper may decrease with increasing distance from the sidewall of the light-absorbing layer.

20 Claims, 6 Drawing Sheets

(56) References Cited

OTHER PUBLICATIONS

Donghwan Ahn et al., "High performance, waveguide integrated Ge photodetectors," Opt. Express 15, 3916-3921 (2007).
Hui Cong et al., "High-speed waveguide-integrated Ge/Si avalanche photodetector", 2016 Chinese Phys. B 25 058503.
Kyle Preston, Yoon Ho Daniel Lee, Mian Zhang, and Michal Lipson, "Waveguide-integrated telecom-wavelength photodiode in deposited silicon," Opt. Lett. 36, 52-54 (2011).
K. Giewont et al., "300-mm Monolithic Silicon Photonics Foundry Technology," in IEEE Journal of Selected Topics in Quantum Electronics, vol. 25, No. 5, pp. 1-11, Sep.-Oct. 2019, Art No. 8200611.
M. Rakowski et al., "45nm CMOS—Silicon Photonics Monolithic Technology (45CLO) for next-generation, low power and high speed optical interconnects," in Optical Fiber Communication Conference (OFC) 2020, OSA Technical Digest (Optical Society of America, 2020), paper T3H.3.
Bian et al., "Monolithically Integrated Silicon Nitride Platform" OFC 2021.
Abdelsalam Aboketaf et al., "Towards Fully Automated Testing and Characterization for Photonic Compact Modeling on 300-mm Wafer Platform", OFC 2021.
Dr. Helmut Schift, "Three dimensional surface topographies", Paul Scherrer Institut, retrieved from the internet at https://www.psi.ch/en/lmn/three-dimensional-structures on Mar. 17, 2021.
microchemicals.com., "Reflow of Photoresist", revised Nov. 7, 2013, retrieved from the internet at https://www.microchemicals.com/technical_information/reflow_photoresist.pdf.
Vadimir Stojanović et al., "Monolithic silicon-photonic platforms in state-of-the-art CMOS SOI processes [Invited]," Opt. Express 26, 13106-13121 (2018).

\* cited by examiner

PHOTODETECTORS AND TERMINATORS INCLUDING A TAPERED THICKNESS

BACKGROUND

The present invention relates to photonics chips and, more specifically, to structures for a photodetector or terminator and methods of forming a structure for a photodetector or terminator.

Photonics chips are used in many high-speed applications and systems including, but not limited to, data communication systems and data computation systems. A photonics chip integrates optical components, such as waveguides, optical switches, and directional couplers, and electronic components, such as field-effect transistors, into a unified platform. Among other factors, layout area, cost, and operational overhead may be reduced by the integration of both types of components on a single chip.

Photonics chips may include photodetectors that convert optical signals in the form of modulated light pulses into an electrical signal. A photodetector may suffer from significant back reflection due to a refractive index mismatch between the material of the photodetector and the material of a waveguide supplying the light pulses to the photodetector. Back reflection contributes to optical return loss, and also contributes to reductions in responsivity and quantum efficiency. Back reflection may be particularly severe for light pulses characterized by the transverse magnetic mode.

Improved structures for a photodetector or terminator and methods of fabricating a structure for a photodetector or terminator are needed.

SUMMARY

In an embodiment of the invention, a structure includes a waveguide core, a light-absorbing layer having a sidewall, and a taper positioned adjacent to the sidewall of the light-absorbing layer. The taper extends laterally from the sidewall of the light-absorbing layer to overlap with the waveguide core, and the taper has a thickness that varies with position relative to the sidewall of the light-absorbing layer.

In an embodiment of the invention, a method includes forming a waveguide core, forming a light-absorbing layer having a sidewall, and forming a taper positioned adjacent to the sidewall of the light-absorbing layer. The taper extends laterally from the sidewall of the light-absorbing layer to overlap with the waveguide core, and the taper has a thickness that varies with position relative to the sidewall of the light-absorbing layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
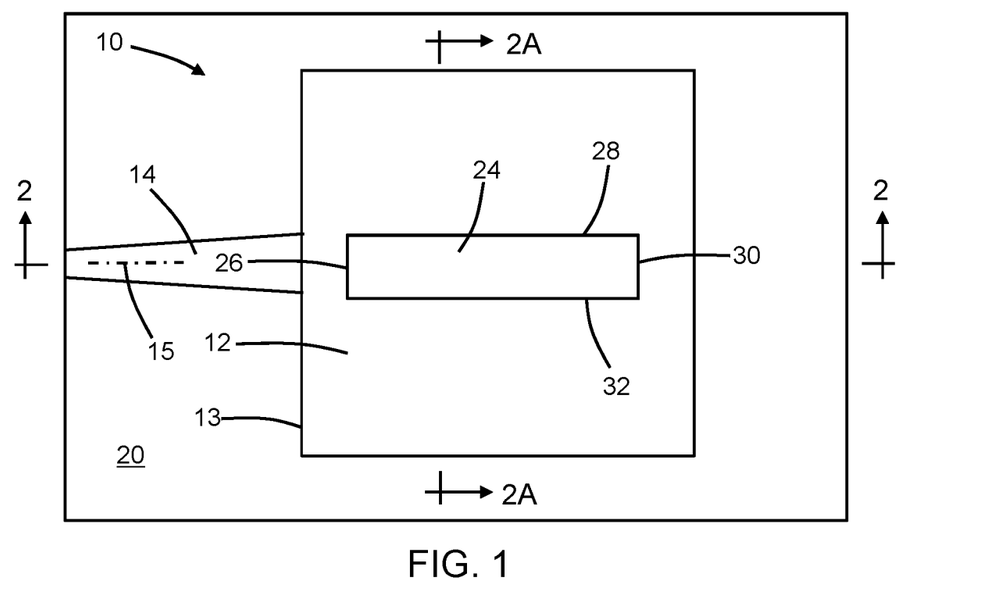
FIG. 1 is a diagrammatic top view of a structure at an initial fabrication stage of a processing method in accordance with embodiments of the invention.
Figure 2:
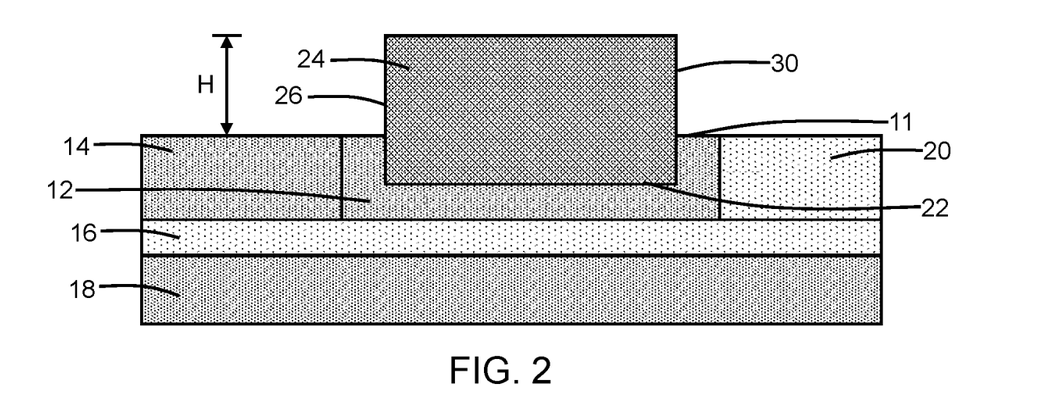
FIG. 2 is a cross-sectional view taken generally along line 2-2 in FIG. 1.
Figure 2A:
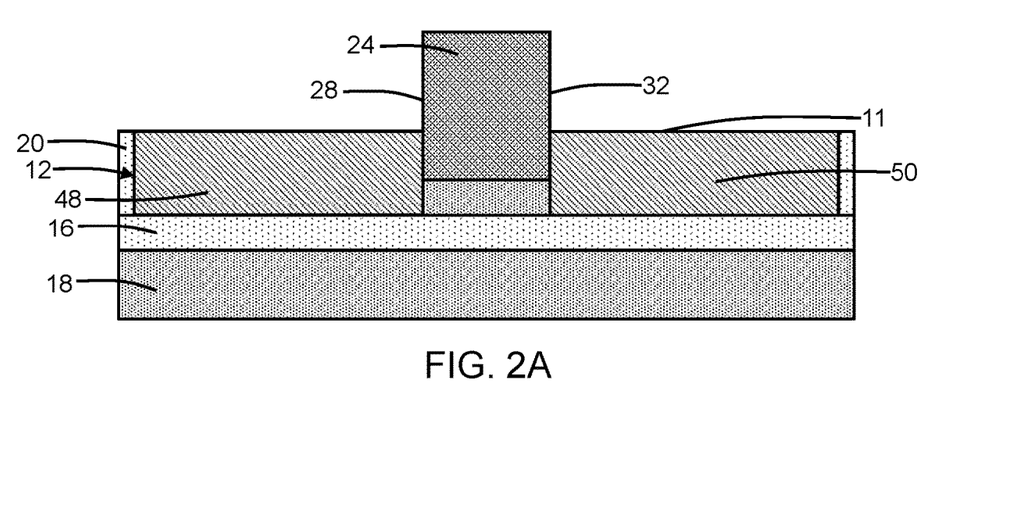
FIG. 2A is a cross-sectional view taken generally along line 2A-2A in FIG. 1.

With reference to FIGS. 1, 2, 2A and in accordance with embodiments of the invention, a structure 10 includes a pad 12 and a waveguide core 14 that is adjoined to the pad 12 at a side edge 13. The waveguide core 14 may be aligned along a longitudinal axis 15. The pad 12 and waveguide core 14 may be comprised of a semiconductor material, such as single-crystal silicon. In an embodiment, the pad 12 and waveguide core 14 may be patterned by lithography and etching processes from a layer of the semiconductor material. The pad 12 and waveguide core 14 may be patterned from the device layer of a semiconductor-on-insulator (SOI) substrate that further includes a dielectric layer 16 in the form of a buried oxide layer and a handle substrate 18. In an embodiment, the pad 12 and waveguide core 14 may have equal or substantially equal thicknesses.

A dielectric layer 20 is deposited and planarized with chemical-mechanical polishing to be coplanar with the pad 12 and waveguide core 14. The dielectric layer 20, which contains a dielectric material (e.g., silicon dioxide), fills the space surrounding the pad 12 and waveguide core 14.

A trench 22 may be etched in the pad 12 using a patterned hardmask (not shown) as an etch mask, and a light-absorbing layer 24 may be formed inside the trench 22. The trench 22 penetrates partially through the thickness of the pad 12. In an embodiment, the light-absorbing layer 24 may be epitaxially grown inside the trench 22 with a chemical vapor deposition process. In an embodiment, the light-absorbing layer 24 may be formed by a selective epitaxial growth process such that the light-absorbing material forms inside the trench 22 but not on the hardmask. In the representative embodiment, the light-absorbing layer 24 includes an upper portion that projects, or has a height H that is, above a top surface 11 of the pad 12 and waveguide core 14, and a lower portion that is arranged below the top surface 11 of the pad 12 and waveguide core 14. The upper portion of the light-absorbing layer 24 includes sidewalls 26, 28, 30, 32 that are arranged about its outer periphery. The sidewall 26 of the light-absorbing layer 24 is positioned adjacent to the waveguide core 14 in a spaced relationship and also adjacent to the side edge 13 of the pad 12. In an embodiment, the lower portion of the sidewall 26 of the light-absorbing layer 24 may be positioned in a spaced relationship adjacent to the waveguide core 14. The sidewalls 28, 32 are angled relative to the sidewall 26 and, in an embodiment, may be arranged orthogonal to the sidewall 26. The sidewall 30 may be laterally spaced from the sidewall 26, and may be connected to the sidewall 26 by the sidewalls 28, 32.

The light-absorbing layer 24 may be comprised of a different material than either the pad 12 and/or the waveguide core 14. In particular, the light-absorbing layer 24 may be comprised of a material that generates charge carriers from absorbed light, whereas the waveguide core 14 is comprised of a material that guides light to the light-absorbing layer 24. In an embodiment, the light-absorbing layer 24 may define a light-absorbing region of a photodetector. In an embodiment, the light-absorbing layer 24 may define a light-absorbing region of a terminator. In an embodiment, the light-absorbing layer 24 may comprise a material having a composition that includes germanium. In an embodiment, the light-absorbing layer 24 may comprise a material having a composition that exclusively includes germanium.

A doped region 48 and a doped region 50 may be formed in respective portions of the pad 12. The doped regions 48, 50 may extend through the entire thickness of the pad 12 to the underlying dielectric layer 16. The doped region 48 and the doped region 50, which have opposite conductivity types, may respectively define an anode and a cathode of a photodetector that also includes the light-absorbing layer 24. In an alternative embodiment, the doped region 48 may extend laterally into a slice or portion of the light-absorbing layer 24 adjacent to the sidewall 28 and/or the doped region 50 may extend laterally into a slice or portion of the light-absorbing layer 24 adjacent to the sidewall 32.

The doped region 48 may be formed by, for example, ion implantation with an implantation mask having an opening that determines the implanted area of the pad 12. The implantation mask may include a layer of a light-sensitive material, such as a photoresist, applied by a spin-coating process, pre-baked, exposed to light projected through a photomask, baked after exposure, and developed with a chemical developer to define an opening arranged over the area of the pad 12 to be implanted. The implantation conditions (e.g., ion species, dose, kinetic energy) may be selected to tune the electrical and physical characteristics of the doped region 48. The implantation mask may be stripped after forming the doped region 48. In an embodiment, the semiconductor material of the doped region 48 may contain a p-type dopant (e.g., boron) that provides p-type electrical conductivity.

The doped region 50 may be formed by, for example, ion implantation with an implantation mask having an opening that determines the implanted area of the pad 12. The implantation mask may include a layer of a light-sensitive material, such as a photoresist, applied by a spin-coating process, pre-baked, exposed to light projected through a photomask, baked after exposure, and developed with a chemical developer to define openings arranged over the area of the pad 12 to be implanted. The implantation conditions (e.g., ion species, dose, kinetic energy) may be selected to tune the electrical and physical characteristics of the doped region 50. The implantation mask may be stripped after forming the doped region 50. In an embodiment, the semiconductor material of the doped region 50 may contain an n-type dopant (e.g., phosphorus and/or arsenic) that provides n-type electrical conductivity.

Figure 3:
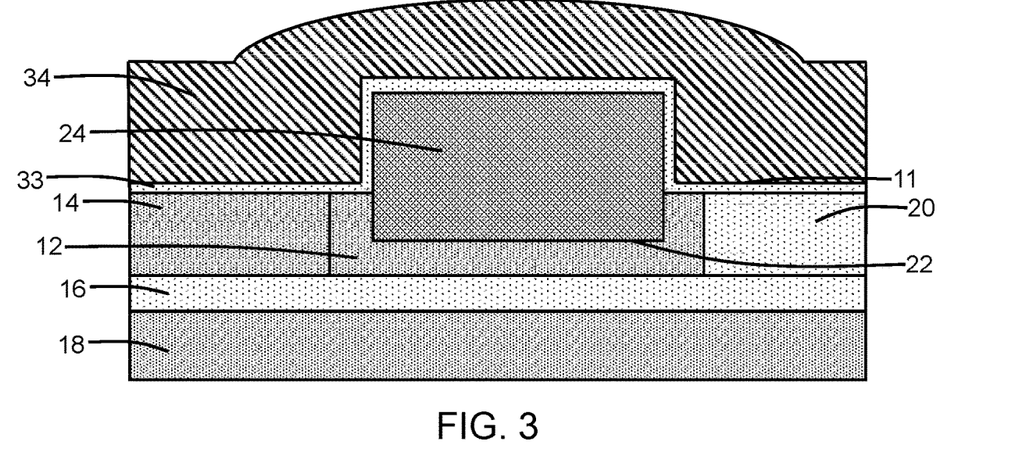
FIG. 3 is a cross-sectional view of the structure at a fabrication stage of the processing method subsequent to FIG. 2.

With reference to FIG. 3 in which like reference numerals refer to like features in FIGS. 1, 2 and at a subsequent fabrication stage, a dielectric layer 33 is formed on the pad 12, waveguide core 14, and light-absorbing layer 24. In an embodiment, the dielectric layer 33 may be comprised of silicon dioxide on the pad 12 and waveguide core 14, and the dielectric layer 33 may be comprised of a germanium oxide on the light-absorbing layer 24.

A layer 34 is deposited on the dielectric layer 33. In an embodiment, the layer 34 includes topography created by the projection of the light-absorbing layer 24 above the pad 12 and waveguide core 14. In an embodiment, the layer 34 may comprise a polycrystalline semiconductor material, such as polycrystalline silicon (i.e., polysilicon). In an alternative embodiment, the layer 34 may comprise a dielectric material, such as silicon nitride.

Figure 4:
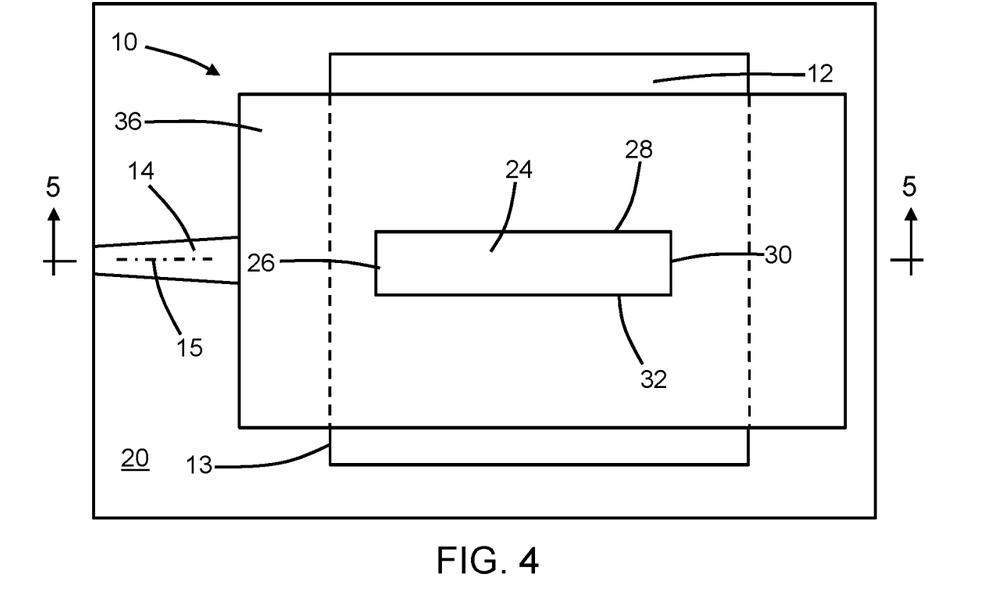
FIG. 4 is a top view of the structure at a fabrication stage of the processing method subsequent to FIG. 3.
Figure 5:
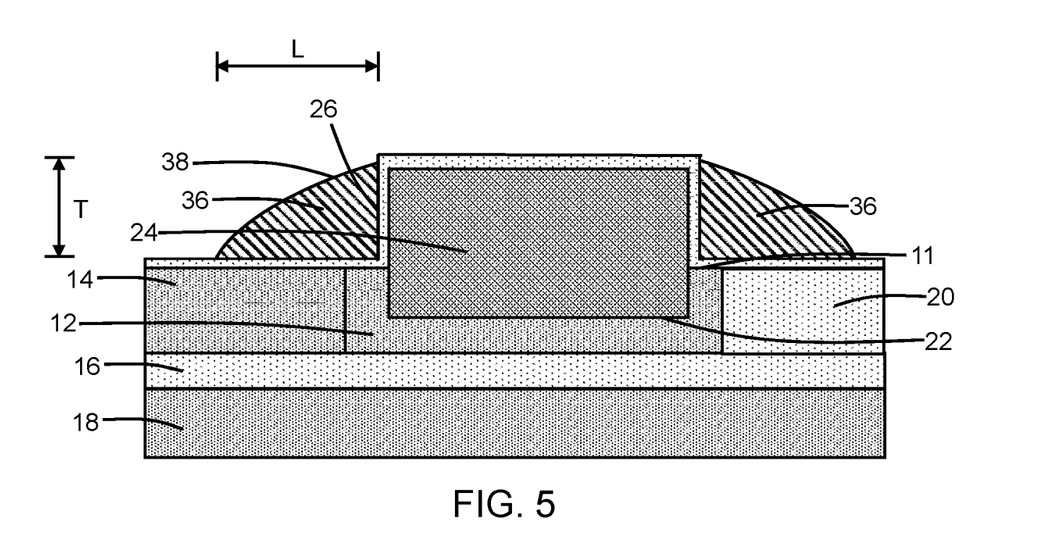
FIG. 5 is a cross-sectional view taken generally along line 5-5 in FIG. 4.

With reference to FIGS. 4, 5 in which like reference numerals refer to like features in FIG. 3 and at a subsequent fabrication stage, a taper 36 is formed from the layer 34. In an embodiment, the taper 36 may be formed by etching the layer 34 with an unmasked anisotropic etching process, such as a reactive ion etching process. In an embodiment, the taper 36 may overlap with the pad 12, the waveguide core 14, and the dielectric layer 20. In an embodiment, the taper 36 may surround the upper portion of the light-absorbing layer 24 and, consequently, be positioned adjacent to all of the sidewalls 26, 28, 30, 32 of the upper portion of the light-absorbing layer 24. In an embodiment, the taper 36 may extend laterally from the sidewall 26 of the light-absorbing layer 24 to overlap with (i.e., have an overlapping arrangement with) the waveguide core 14.

The taper 36 has a thickness T relative to the top surface 11 of the pad 12 and waveguide core 14. The thickness T of the taper 36 tapers in a vertical direction relative to the top surface 11 of the pad 12 and waveguide core 14. In that regard, the thickness T of the taper 36 may vary with position relative to the sidewalls 26, 28, 30, 32 of the upper portion of the light-absorbing layer 24. In an embodiment, the thickness T of the taper 36 may decrease with increasing distance from each of the sidewalls 26, 28, 30, 32. In the representative embodiment, the thickness of the taper 36 may have a maximum value that is less than or equal to the height H of the upper portion of the light-absorbing layer 24. The taper 36 has a length L that extends from the position at which the thickness has its maximum value to a position of zero thickness.

The taper 36 has a top surface 38 that extends laterally from the sidewalls 26, 28, 30, 32 of the upper portion of the light-absorbing layer 24 over the pad 12, waveguide core 14, and dielectric layer 20. In an embodiment, the top surface 38 of the taper 36 may be contoured with a curvature that deviates from planarity (i.e., the top surface 38 is non-planar) relative to the top surface 11 of the waveguide core 14. In an embodiment, the thickness T may decrease non-linearly with increasing distance from the sidewalls 26, 28, 30, 32 of the upper portion of the light-absorbing layer 24. In an embodiment, the top surface 38 of the taper 36 is shaped with a convex curvature (i.e., a convex-upward shape relative to the top surface 11 of the waveguide core 14) in which the thickness T decreases non-linearly with increasing distance from the sidewalls 26, 28, 30, 32 of the upper portion of the light-absorbing layer 24.

Middle-of-line (MOL) processing and back-end-of-line (BEOL) processing follow, which includes formation of dielectric layers, silicide, contacts, vias, and wiring for an interconnect structure that is coupled with the photodetector. In an alternative embodiment, the doped regions 48, 50 may be omitted from the structure 10 such that the structure 10 defines a terminator.

In use, modulated laser light may be guided by the waveguide core 14 to the light-absorbing layer 24. The light-absorbing layer 24 absorbs photons of the modulated laser light and converts the absorbed photons into charge carriers. The biasing of the doped regions 48, 50 causes the charge carriers to be collected and output to provide, as a function of time, a measurable photocurrent. The portion of the taper 36 arranged between the waveguide core 14 and the light-absorbing layer 24 may reduce the back reflection of laser light into the waveguide core 14 and, in particular, the back reflection of laser light characterized by the transverse magnetic (TM) mode into the waveguide core 14. The taper 36 may effectively reduce the refractive index mismatch between the different materials of the waveguide core 14 and the light-absorbing layer 24.

Figure 6:
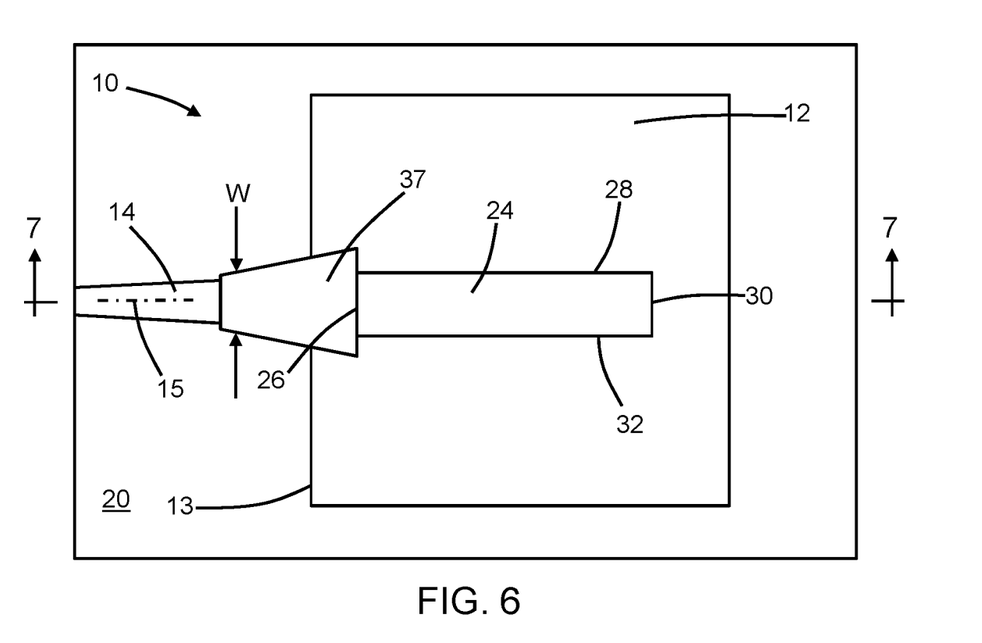
FIG. 6 is a top view of a structure in accordance with alternative embodiments of the invention.
Figure 7:
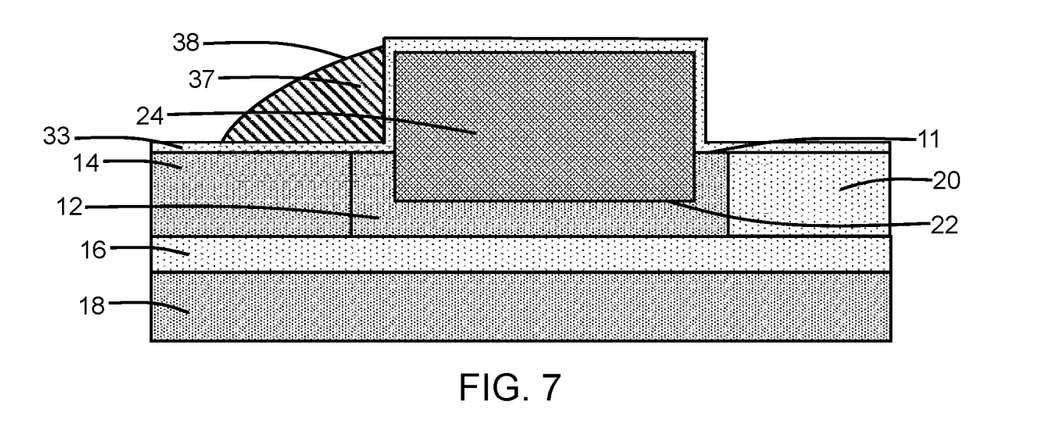
FIG. 7 is a cross-sectional view taken generally along line 7-7 in FIG. 6.

With reference to FIGS. 6, 7 in which like reference numerals refer to like features in FIGS. 4, 5 and in accordance with alternative embodiments, a taper 37 may be formed by further patterning the taper 36 with lithography and etching processes. The taper 37 is arranged between the waveguide core 14 and the light-absorbing layer 24. The patterning may remove the taper 36 with the exception of a section of the taper 36 that provides the taper 37. In an embodiment, the taper 37 may have a tapered width dimension W that decreases with increasing distance from the sidewall 26 of the light-absorbing layer 24. As a result, the taper 37 tapers in multiple dimensions and, in the representative embodiment, tapers in both thickness (i.e., in a vertical direction) and width dimension (i.e., in a lateral direction). In an embodiment, the taper 37 may be extend laterally from the sidewall 26 of the light-absorbing layer 24 to overlap with the waveguide core 14. In an embodiment, the taper 37 may be centered relative to the longitudinal axis 15 of the waveguide core 14 and, therefore, symmetrical relative to the longitudinal axis 15.

Figure 8:
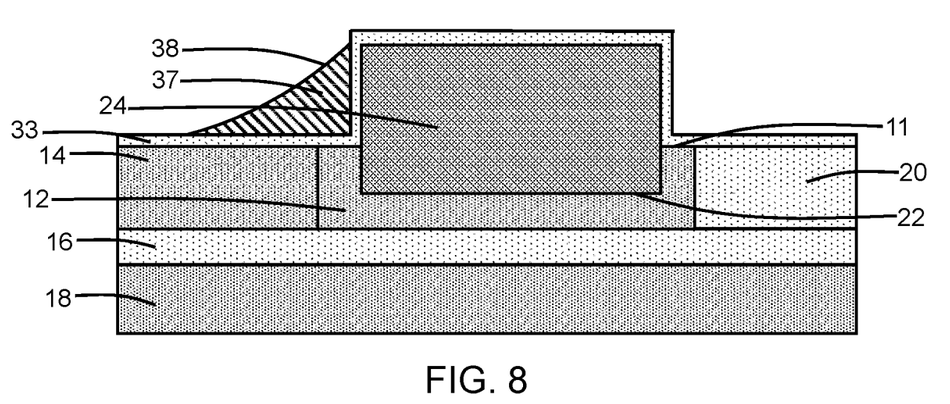
FIG. 8 is a cross-sectional view of a structure in accordance with alternative embodiments of the invention.

With reference to FIG. 8 in which like reference numerals refer to like features in FIG. 7 and in accordance with alternative embodiments, the top surface 38 of the taper 37 may be contoured with a non-linear curvature that has a concave-upward shape, rather than a convex-upward shape, relative to the top surface 11 of the waveguide core 14. The concave-upward shape of the top surface 38 provides a thickness that varies with position from the sidewall 26 of the light-absorbing layer 24. To generate the concave upward shape, the taper 37 may be further patterned by lithography and etching processes in which the etch mask has an opening over the taper 37 that is shaped to adjust the local etch rate. During etching, the local variations in etch rate are effective to convert the convex-upward shape of the top surface 38 to a concave-upward shape. In an alternative embodiment, the concave-upward shape of the top surface 38 may be formed by patterning a uniformly-thick, block-shaped taper using an etch mask that is shaped to adjust the local etch rate.

Figure 9:
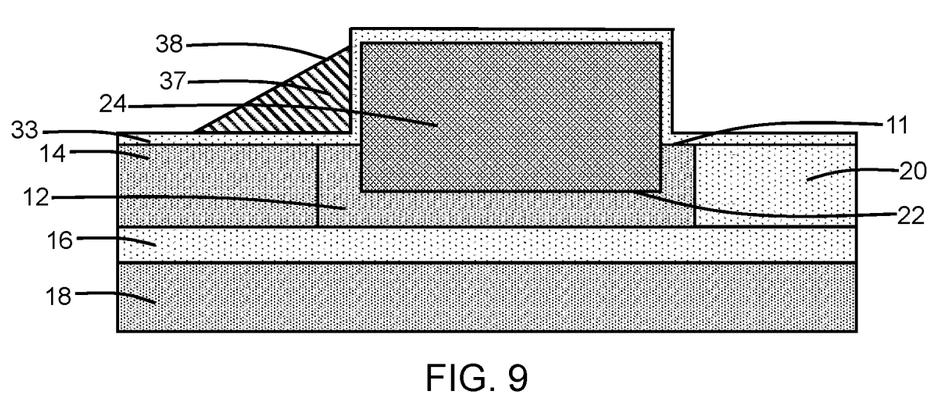
FIG. 9 is a cross-sectional view of a structure in accordance with alternative embodiments of the invention.

With reference to FIG. 9 in which like reference numerals refer to like features in FIG. 7 and in accordance with alternative embodiments, the top surface 38 of the taper 37 may be contoured as a planar incline, rather than having either a concave-upward shape or a convex-upward shape, relative to the top surface 11 of the waveguide core 14 to provide the thickness that varies with position relative to the sidewall 26 of the light-absorbing layer 24. To generate the inclined-plane shape, the taper 37 may be further patterned by lithography and etching processes in which the etch mask has an opening over the taper 37 that is shaped to adjust the local etch rate. During etching, the local variations in etch rate are effective to convert the convex-upward shape of the top surface 38 to an inclined-plane shape. In an alternative embodiment, the inclined-plane shape of the top surface 38 may be formed by patterning a uniformly-thick, block-shaped taper using an etch mask that is shaped to adjust the local etch rate.

Figure 10:
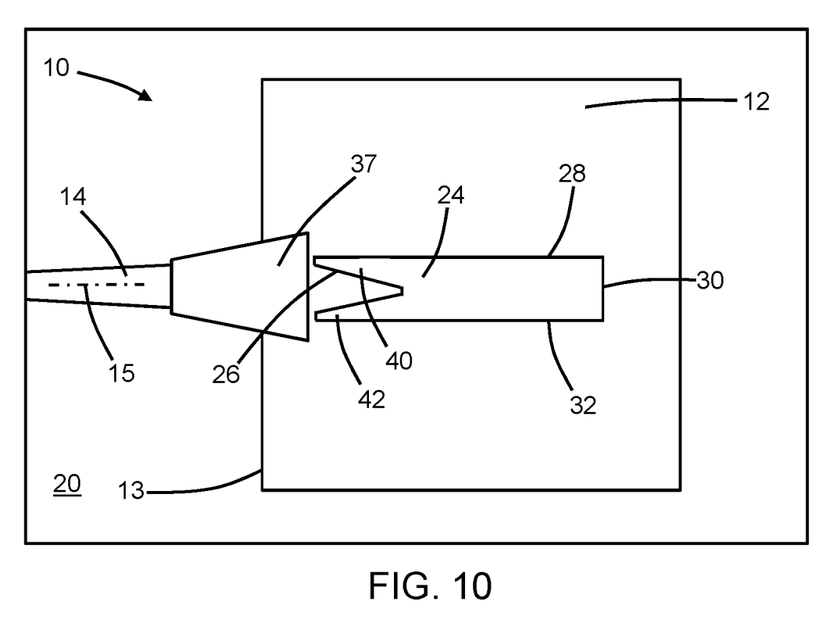
FIG. 10 is a top view of a structure in accordance with alternative embodiments of the invention.

With reference to FIG. 10 in which like reference numerals refer to like features in FIG. 6 and in accordance with alternative embodiments, the light-absorbing layer 24 may be formed with tapers 40, 42 defining an indentation in the sidewall 26. The taper 37, which may be laterally spaced from the tapers 40, 42, may be formed by patterning a uniformly-thick, block-shaped taper using an etch mask that is shaped to adjust the local etch rate.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
 a waveguide core;
 a light-absorbing layer having a first sidewall; and
 a taper positioned adjacent to the first sidewall of the light-absorbing layer, the taper extending laterally from the first sidewall of the light-absorbing layer to overlap with the waveguide core, and the taper having a thickness that varies with position relative to the first sidewall of the light-absorbing layer.

2. The structure of claim 1 wherein the thickness of the taper decreases with increasing distance from the first sidewall of the light-absorbing layer.

3. The structure of claim 2 wherein the taper has a width dimension that decreases with increasing distance from the first sidewall of the light-absorbing layer.

4. The structure of claim 1 wherein the taper has a width dimension that decreases with increasing distance from the first sidewall of the light-absorbing layer.

5. The structure of claim 4 wherein the waveguide core has a longitudinal axis, and the taper is centered relative to the longitudinal axis of the waveguide core.

6. The structure of claim 1 wherein the waveguide core has a top surface, the taper has a top surface that extends from the first sidewall of the light-absorbing layer to the waveguide core, and the top surface is shaped concave upward relative to the top surface of the waveguide core.

7. The structure of claim 1 wherein the waveguide core has a top surface, the taper has a top surface that extends from the first sidewall of the light-absorbing layer to the waveguide core, and the top surface is shaped convex upward relative to the top surface of the waveguide core.

8. The structure of claim 1 wherein the waveguide core has a top surface, the taper has a top surface that extends from the first sidewall of the light-absorbing layer over the waveguide core, and the top surface is shaped as a planar incline relative to the top surface of the waveguide core.

9. The structure of claim 1 wherein the waveguide core has a top surface, the taper has a top surface that extends from the first sidewall of the light-absorbing layer over the waveguide core, and the top surface is non-planar relative to the top surface of the waveguide core.

10. The structure of claim 1 wherein the light-absorbing layer has a second sidewall angled relative to the first sidewall, and the taper is further positioned adjacent to the second sidewall of the light-absorbing layer.

11. The structure of claim 1 further comprising:
 a pad connected to the waveguide core,
 wherein the light-absorbing layer is positioned on the pad adjacent to the waveguide core, and the taper overlaps with the waveguide core and the pad.

12. The structure of claim 11 wherein the light-absorbing layer projects above the pad by a height, and the thickness of the taper is less than or equal to the height.

13. The structure of claim 1 wherein the taper is comprised of polysilicon.

14. The structure of claim 1 further comprising:
 a dielectric layer positioned between the first sidewall of the light-absorbing layer and the taper.

15. The structure of claim 1 wherein the light-absorbing layer includes a first taper and a second taper, and the first taper and the second taper define an indentation in the first sidewall of the light-absorbing layer.

16. A method comprising:
 forming a waveguide core;
 forming a light-absorbing layer having a sidewall; and
 forming a taper positioned adjacent to the sidewall of the light-absorbing layer, the taper extending laterally from the sidewall of the light-absorbing layer to overlap with the waveguide core, and the taper having a thickness that varies with position relative to the sidewall of the light-absorbing layer.

17. The method of claim 16 further comprising:
 patterning the taper with lithography and etching processes such that the taper has a width dimension that decreases with increasing distance from the sidewall of the light-absorbing layer.

18. The method of claim 16 wherein forming the taper adjacent to the sidewall of the light-absorbing layer comprises:
 depositing a layer of a material over the waveguide core and the light-absorbing layer; and
 anisotropically etching the layer to form the taper.

19. The method of claim 16 wherein the waveguide core has a top surface, the taper has a top surface that extends from the sidewall of the light-absorbing layer to the waveguide core, and the top surface is shaped concave upward or concave downward relative to the top surface of the waveguide core.

20. The method of claim 16 wherein the waveguide core has a top surface, the taper has a top surface that extends from the sidewall of the light-absorbing layer over the waveguide core, and the top surface is non-planar relative to the top surface of the waveguide core.

* * * * *